(12) United States Patent
Zhang et al.

(10) Patent No.: US 9,991,135 B2
(45) Date of Patent: Jun. 5, 2018

(54) METHOD FOR FABRICATING A METAL OXIDE THIN FILM TRANSISTOR

(71) Applicant: SHENZHEN GRADUATE SCHOOL, PEKING UNIVERSITY, Shenzhen (CN)

(72) Inventors: Shengdong Zhang, Shenzhen (CN); Yang Shao, Shenzhen (CN); Xiang Xiao, Shenzhen (CN); Xin He, Shenzhen (CN)

(73) Assignee: SHENZHEN GRADUATE SCHOOL, PEKING UNIVERSITY, Shenzhen (CN)

( * ) Notice: Subject to any disclaimer, the term of this patent is extended or adjusted under 35 U.S.C. 154(b) by 0 days. days.

(21) Appl. No.: 15/521,246

(22) PCT Filed: Oct. 31, 2014

(86) PCT No.: PCT/CN2014/000963
§ 371 (c)(1),
(2) Date: Apr. 21, 2017

(87) PCT Pub. No.: WO2016/061715
PCT Pub. Date: Apr. 28, 2016

(65) Prior Publication Data
US 2017/0316953 A1  Nov. 2, 2017

(30) Foreign Application Priority Data
Oct. 21, 2014  (CN) .......................... 2014 1 0562680

(51) Int. Cl.
*H01L 21/473*  (2006.01)
*H01L 29/786*  (2006.01)
(Continued)

(52) U.S. Cl.
CPC ...... *H01L 21/473* (2013.01); *H01L 21/02244* (2013.01); *H01L 21/02258* (2013.01);
(Continued)

(58) Field of Classification Search
None
See application file for complete search history.

(56) References Cited

U.S. PATENT DOCUMENTS 9,040,344 B2 * 5/2015 Choi ................. H01L 21/02565
438/104
9,786,696 B2 * 10/2017 Wang ................. H01L 27/1255
(Continued)

FOREIGN PATENT DOCUMENTS

| CN | 102122620 A | 7/2011 |
| CN | 102157565 A | 8/2011 |
| CN | 103325840 A | 9/2013 |

OTHER PUBLICATIONS

ISA State Intellectual Property Office of the People's Republic of China, International Search Report Issued in Application No. PCT/CN2014/000963, dated Jun. 23, 2015, WIPO, 4 pages.

*Primary Examiner* — Andres Munoz
(74) *Attorney, Agent, or Firm* — McCoy Russell LLP

(57) ABSTRACT

A method for fabricating a metal oxide thin film transistor comprises selecting a substrate and fabricating a gate electrode thereon; growing a layer of dielectric or high permittivity dielectric on the substrate to serve as a gate dielectric layer; growing a first metal layer on the gate dielectric layer and a second metal layer on the first metal layer; fabricating a channel region at a middle position of the first metal layer and a passivation region at a middle position of the second metal layer; anodizing the metals of the passivation region and the channel region at atmospheric pressure and room temperature; fabricating a source and a drain; forming an active region comprising the source, the drain, and the
(Continued)

channel region; depositing a silicon nitride layer on the active region; fabricating two electrode contact holes; depositing a metal aluminum film; and fabricating two metal contact electrodes by photolithography and etching.

10 Claims, 7 Drawing Sheets

(51) Int. Cl.
*H01L 29/66* (2006.01)
*H01L 21/02* (2006.01)
*H01L 21/475* (2006.01)
*H01L 21/443* (2006.01)

(52) U.S. Cl.
CPC ...... *H01L 21/02614* (2013.01); *H01L 21/443* (2013.01); *H01L 21/475* (2013.01); *H01L 29/66969* (2013.01); *H01L 29/7869* (2013.01); *H01L 29/78606* (2013.01); *H01L 21/02554* (2013.01); *H01L 21/02565* (2013.01)

(56) References Cited

U.S. PATENT DOCUMENTS

| | | | |
|---|---|---|---|
| 2009/0325341 A1* | 12/2009 | Itagaki | H01L 29/7869 438/104 |
| 2010/0224873 A1* | 9/2010 | Sakata | H01L 29/78606 257/43 |
| 2011/0017989 A1* | 1/2011 | Chen | H01L 27/1225 257/43 |
| 2012/0112180 A1* | 5/2012 | Zan | H01L 29/78606 257/43 |
| 2013/0122649 A1* | 5/2013 | Zhang | H01L 29/66742 438/104 |
| 2014/0011329 A1* | 1/2014 | Zhang | H01L 29/66969 438/158 |
| 2014/0175426 A1 | 6/2014 | Tsang | |
| 2016/0043227 A1* | 2/2016 | Zhang | H01L 29/7869 257/43 |
| 2017/0317195 A1* | 11/2017 | Zhang | H01L 29/66969 |

* cited by examiner

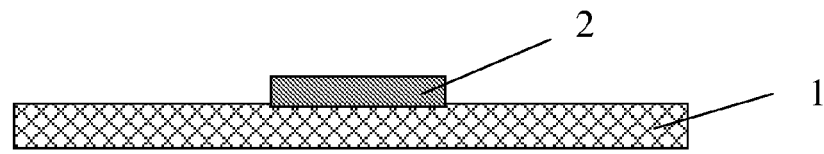
FIG. 1.1
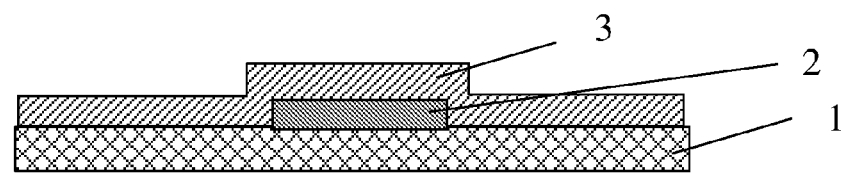
FIG. 1.2
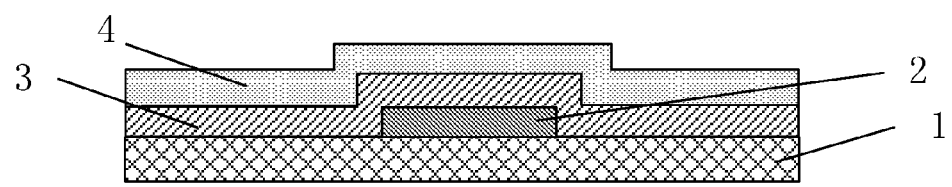
FIG. 1.3
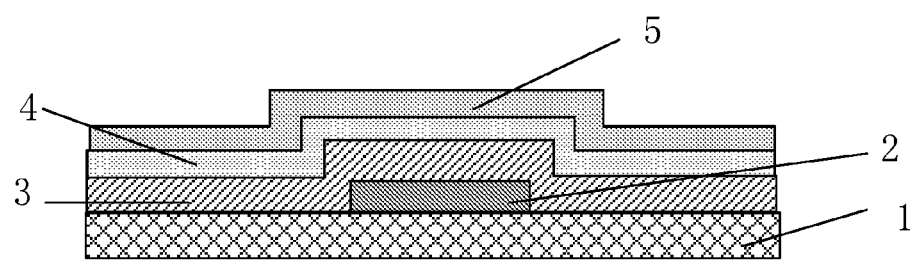
FIG. 1.4

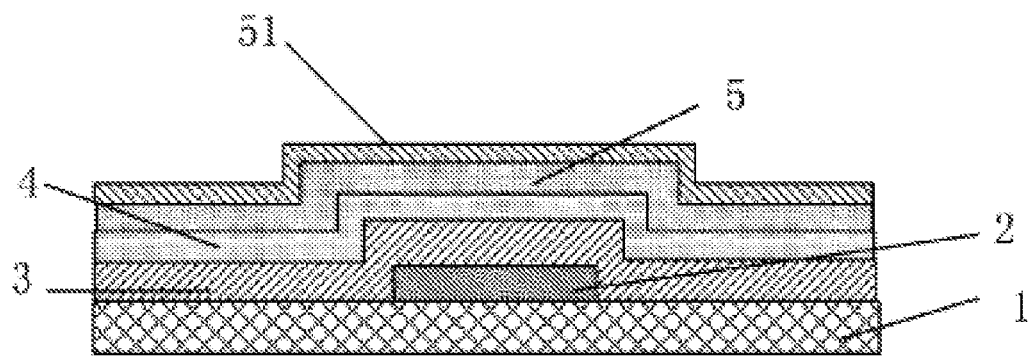
FIG. 1.5
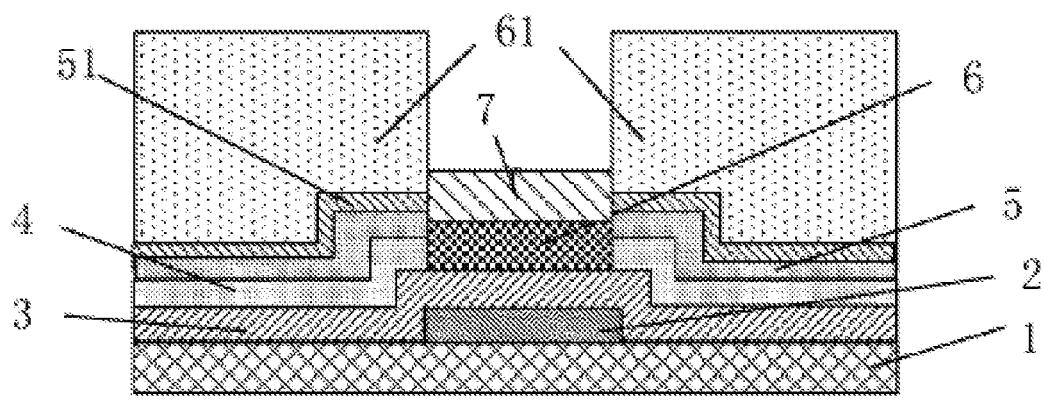
FIG. 1.6
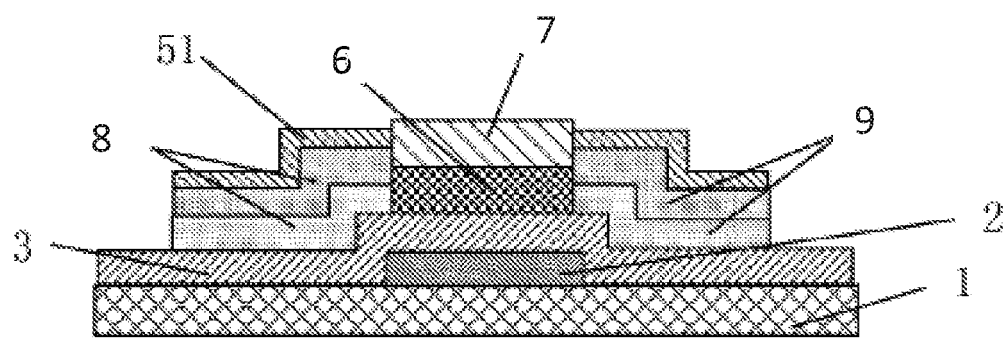
FIG. 1.7

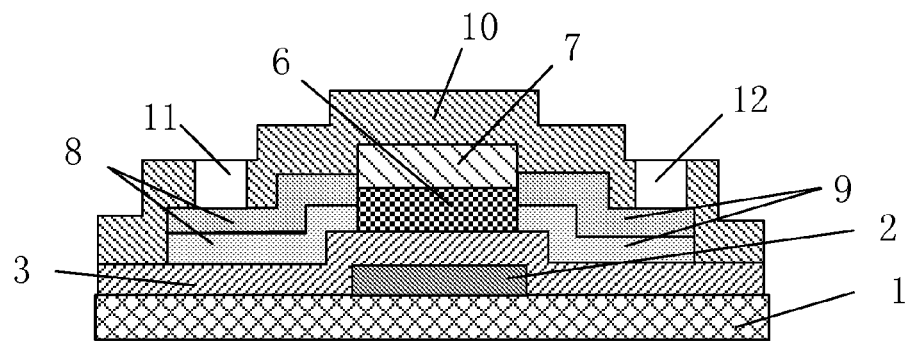
FIG. 1.8
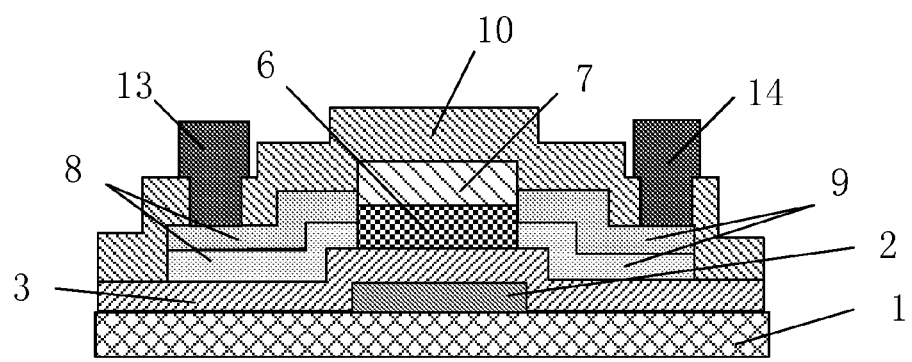
FIG. 1.9
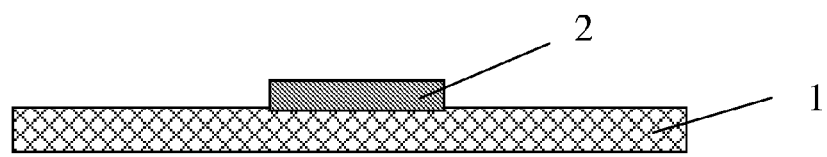
FIG. 2.1
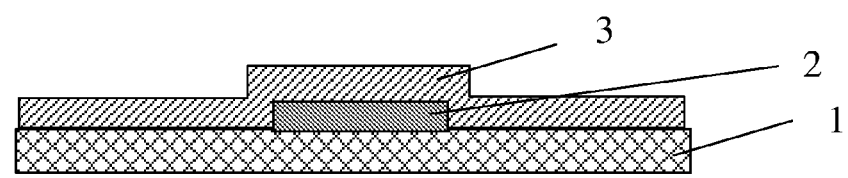
FIG. 2.2

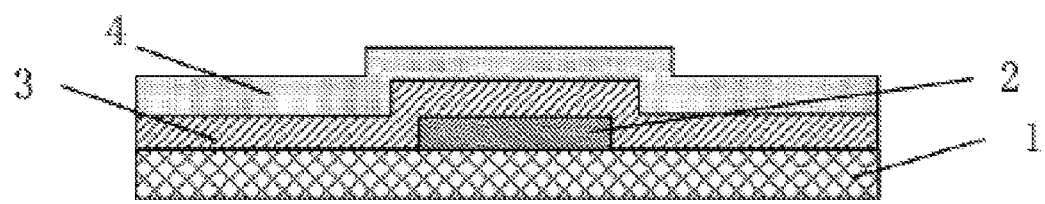
FIG. 2.3
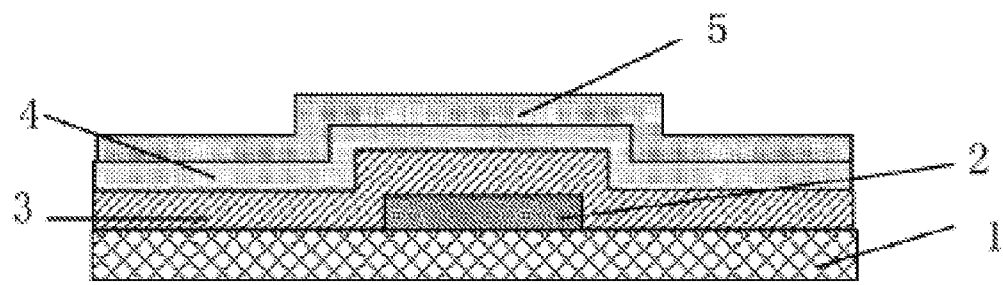
FIG. 2.4
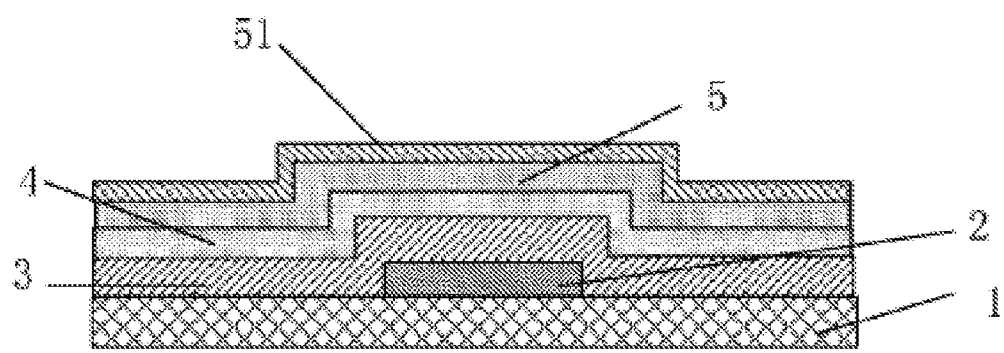
FIG. 2.5
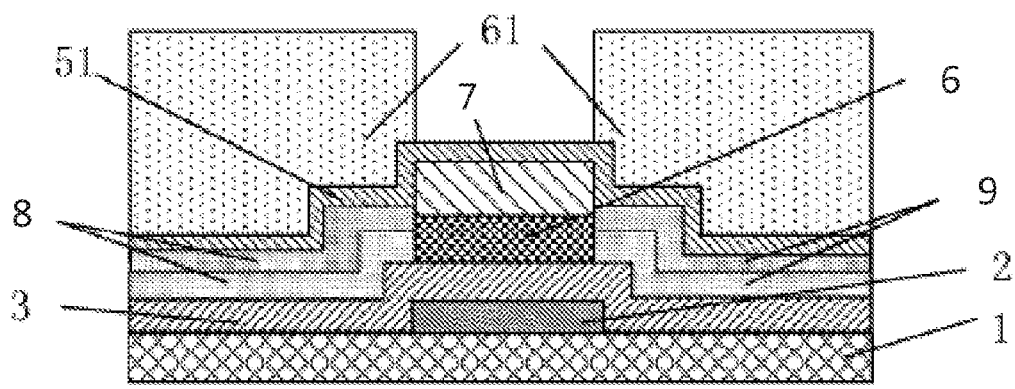
FIG. 2.6

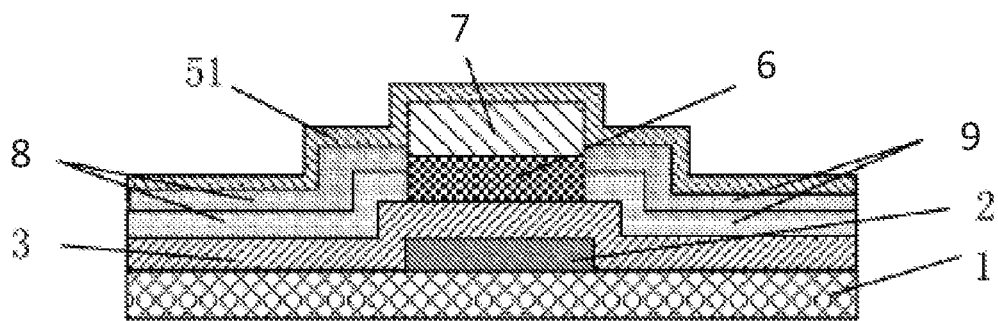
FIG. 2.7
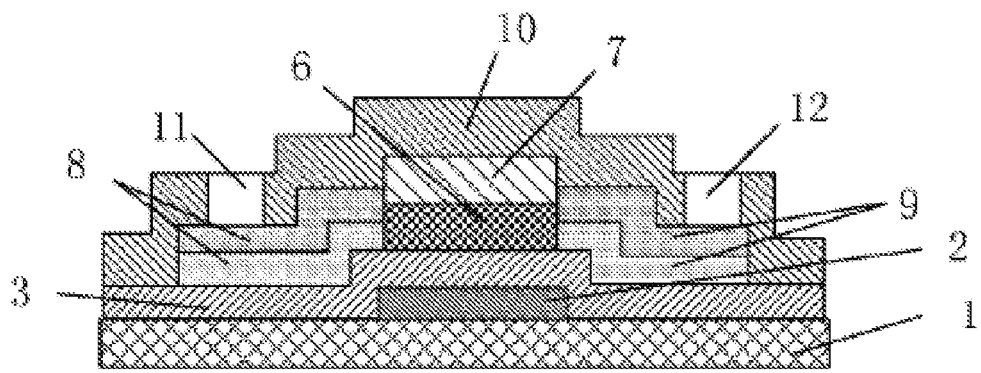
FIG. 2.8
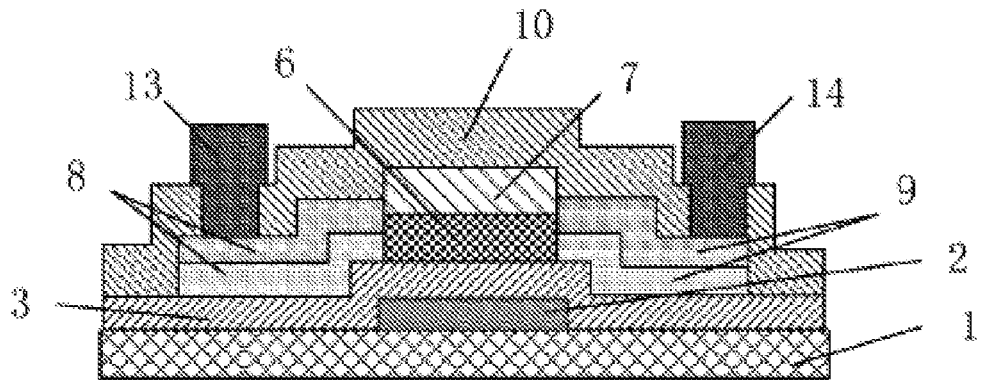
FIG. 2.9
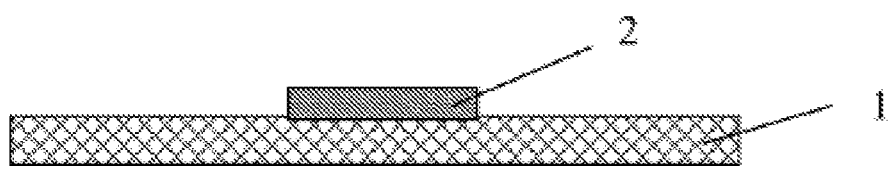
FIG. 3.1

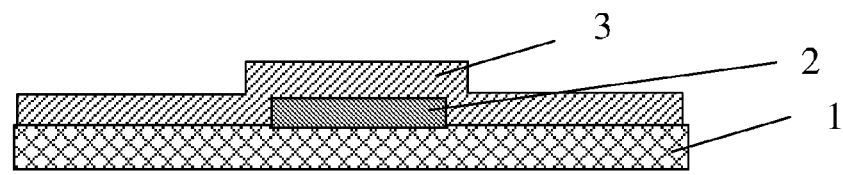
FIG. 3.2
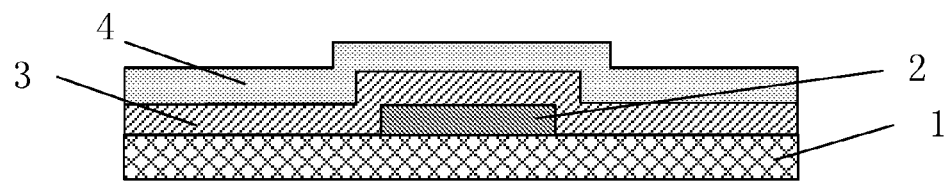
FIG. 3.3
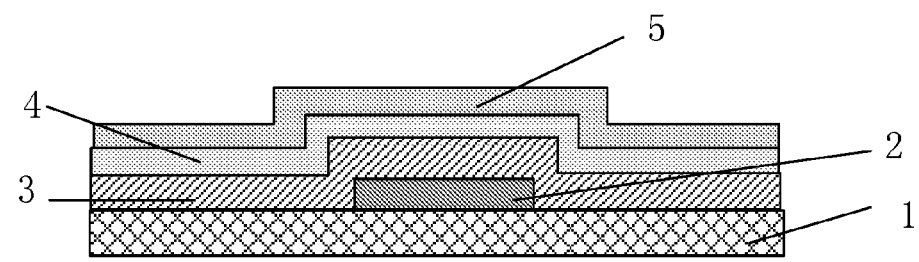
FIG. 3.4
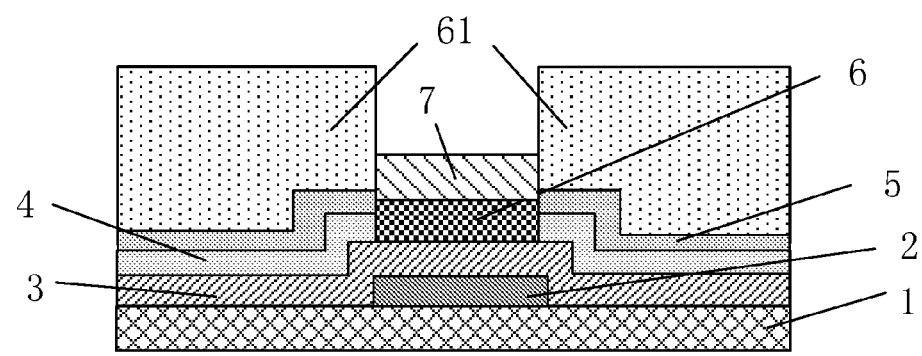
FIG. 3.5

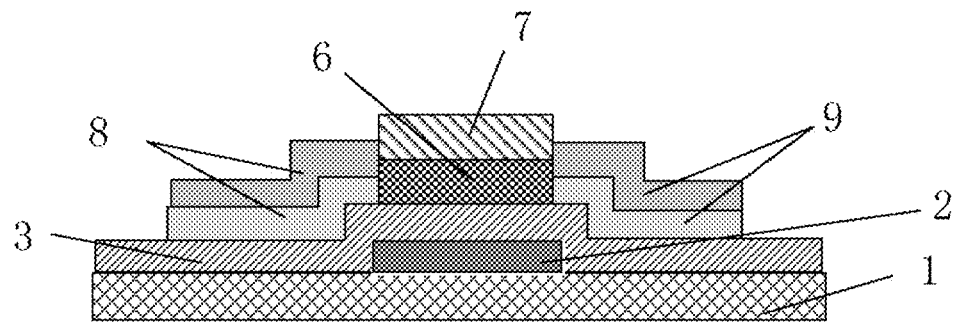
FIG. 3.6
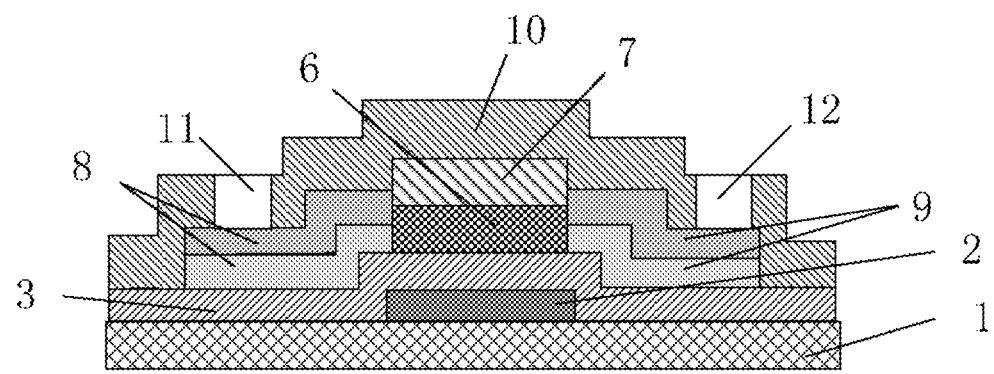
FIG. 3.7
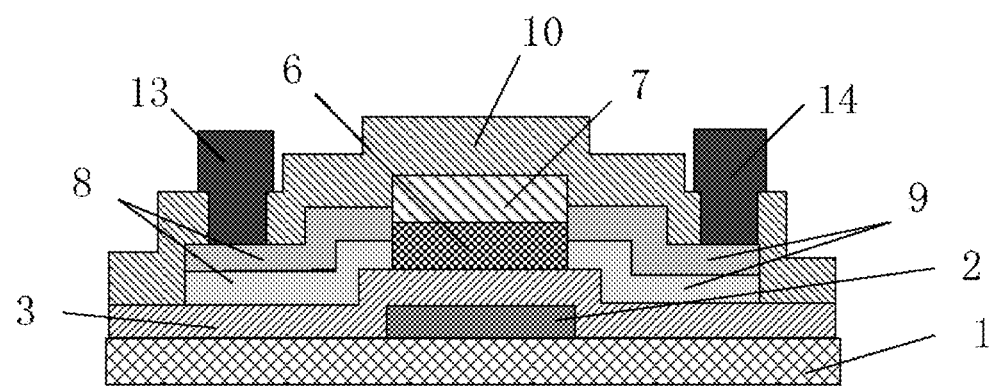
FIG. 3.8

METHOD FOR FABRICATING A METAL OXIDE THIN FILM TRANSISTOR

CROSS-REFERENCE TO RELATED APPLICATIONS

The present application is a U.S. National Phase of International Patent Application Serial No. PCT/CN2014/000963 entitled "METHOD FOR FABRICATING METALLIC OXIDE THIN FILM TRANSISTOR," filed on Oct. 31, 2014. International Patent Application Serial No. PCT/CN2014/000963 claims priority to Chinese Patent Application No. 201410562680.6 filed on Oct. 21, 2014. The entire contents of each of the above-referenced applications are hereby incorporated by reference for all purposes.

TECHNICAL FIELD

The present invention relates to a method for fabricating a transistor, in particular to a method for fabricating a metal oxide thin film transistor.

BACKGROUND

Thin film transistors have always been integrated elements of peripheral drive circuits or switch control elements of flat panel display. In addition, thin film transistors are also widely studied and used in the fields of sensors, memories, processors and the like. The thin film transistors which are widely used in industry at present are mainly traditional silicon-based thin film transistors, such as amorphous silicon thin film transistors and polycrystalline silicon thin film transistors. However, with the continuous development of display technologies, these silicon-based thin film transistors cannot meet increasingly high requirements of people on flat panel display technology. In amorphous silicon thin film transistors, the main disadvantages are low mobility, easily degraded performance, and the like, which greatly restrict their applications in aspects of OLED pixel driving circuit, the integration of LCD and OLED peripheral drive circuit and the like. Polycrystalline silicon thin film transistors have disadvantages of high process temperature, high manufacturing cost and poor device performance uniformity, thus they are not suitable for large-size flat panel display application. Therefore, in order to develop the flat panel display technology, metal oxide thin film transistor is a novel thin film transistor technology which is widely studied in recent years.

Metal oxide thin film transistors have low process temperature, low process cost, high carrier mobility as well as uniform and stable device performance, the metal oxide thin film transistors not only have advantages of both amorphous silicon thin film transistors and polycrystalline silicon thin film transistors, but also have advantages such as high visible light transmittance, which are promising for application in the next generation of large size, high resolution and high frame rate transparent display. The channel layer materials used in metal oxide thin film transistors mainly include zinc oxide (ZnO), indium oxide ($In_2O_3$), indium gallium zinc oxide (GIZO), zinc tin oxide (ZTO), indium zinc oxide (IZO), indium zinc tin oxide (TIZO), stannic oxide ($SnO_2$), stannous oxide (SnO), cuprous oxide ($Cu_2O$), etc.

In a bottom-gate thin film transistor fabricating process, a passivation layer is generally an indispensable protection layer isolating the channel from the atmosphere, which is deposited after formation of a channel layer, a source and drain. However, growth conditions of the passivation layer generally affect electrical performances of a device, for example, during a process of growing a $SiO_2$ passivation layer by commonly used Plasma Enhanced Chemical Vapor Deposition (PECVD), the back channels usually suffer from plasma bombardment, the hydrogen ions are introduced, and the like, such that the channel layer becomes electrically conductive, the threshold voltage shifts to the negative direction, device performances are degraded, current leakage increases, etc. These adverse influences make it harsh and difficult to control the growth conditions of the passivation layer. As a result, how to grow a passivation layer becomes a technical difficulty which needs to be broken through in fabrication of thin film transistors. On the other hand, the channel layer is a high resistance layer with low carrier concentration, it is needed to add a process to reduce parasitic resistance of the source and drain portions by additionally adding a low resistance metal layer, the complexity of fabrication process is increased.

SUMMARY

For the above problems, the purpose of the present invention is to provide a method for fabricating a metal oxide thin film transistor. The method can prevent back surfaces of channels from being bombarded by plasma and prevent device characteristics from being degraded due to the damage of back channels.

Another purpose is to simplify a method process and reduce production costs.

Another purpose is that the bottom metal is not in direct contact with the solution during the anodic oxidation of double-layer metal films because of being protected by the upper metal, thus some metals and their oxides that are not resistant to the acid and alkali could also be anodized with the protection of upper metal.

In order to realize the above purposes, the present invention adopts the following technical solution: a method for fabricating a metal oxide thin film transistor comprises the following steps: 1) selecting a substrate, growing a layer of metal film or transparent conductive film on the substrate, then forming a gate electrode at a central position of the substrate by using photolithography and etching the metal film or the transparent conductive film; 2) growing a layer of dielectric or high permittivity dielectric on the substrate, and the layer of dielectric or high permittivity dielectric covers the gate electrode to serve as a gate dielectric layer; 3) growing a first metal layer with thickness of 10~100 nm on the gate dielectric layer, the growing method uses a direct current magnetron sputtering method, metal or alloy target is used, purity is greater than or equal to 99.99%, sputtering pressure is 0.3~2.5 Pa, gas is pure argon; 4) growing a second metal layer with thickness of 50~300 nm on the first metal layer, the growing method also uses the direct current magnetron sputtering method, metal or alloy target is used, purity is greater than or equal to 99.99%, sputtering pressure is 0.3~2.5 Pa, gas is pure argon; 5) fabricating a channel region at a middle position of the first metal layer, fabricating a passivation region at a middle position of the second metal layer, the passivation layer is located on the channel region; then the metals of the passivation region and the channel region are anodized at atmospheric pressure and room temperature, anodic oxidation turns the first metal layer into a metal oxide semiconductor layer and turns the second metal layer into a metal oxide dielectric layer; the metal oxide semiconductor layer is the channel layer of the thin film transistor, the metal oxide dielectric layer becomes the passivation layer of the channel layer; 6) fabricating a source and a drain, forming an active region comprising the source, the drain and the channel region; the source and the drain are located at two sides of the channel region and connected with the channel region, the source and the drain are formed by double-layer metal films that consist of the first metal layer and the second metal layer which are not subjected to the anodic oxidation treatment; 7) depositing a silicon nitride layer on the active region by using the method of plasma enhanced chemical vapor deposition or magnetron sputtering, the silicon nitride layer covers the gate dielectric layer, then photolithography and etching are used on the silicon nitride layer on one side of the source and one side of the drain, forming two contact holes of electrodes; 8) depositing a layer of metal aluminum film on the top surface of the entire device by using the magnetron sputtering method, then fabricating two metal contact electrodes of the thin film transistor by photolithography and etching, the two metal contact electrodes lead out each electrode of the thin film transistor, the fabrication of the metal oxide thin film transistor is completed.

In the step 5), the method for fabricating the channel region and the passivation region is as follows: growing a layer of silicon nitride film with thickness of 50 nm on the second metal layer by using the plasma enhanced chemical vapor deposition method as a dielectric protection layer, coating photoresist on the dielectric protection layer, using photolithography and etching the dielectric protection layer, the passivation region is exposed at the middle position of the second metal layer, the region of the first metal layer to which the passivation region corresponds is the channel region.

In the step 5), the method for fabricating the channel region and the passivation region is as follows: growing a layer of silicon nitride film with thickness of 50 nm on the second metal layer by using the plasma enhanced chemical vapor deposition method as a dielectric protection layer, coating photoresist on the dielectric protection layer, then by the exposure and development of the photoresist, opening a window on the dielectric protection layer, but not etching the dielectric protection layer, the region of the window corresponds to the channel region and the passivation region of the transistor.

In the step 6), the method for fabricating the source and the drain is as follows: removing the photoresist, using photolithography and etching the dielectric protection layer and the first metal layer and the second metal layer under the dielectric protection layer, forming the source and the drain.

In the step 5), the method for fabricating the channel region and the passivation region is as follows: coating photoresist on the second metal layer, then by exposure and development of the photoresist the passivation region of the second metal layer is exposed, the region of the first metal layer to which the passivation region corresponds is the channel region, the other portion is covered and protected by the photoresist.

In the step 5), the method for fabricating the source and the drain is as follows: removing the photoresist layer, performing photolithography and etching for the first metal layer and the second metal layer, forming the source and the drain.

In the step 1), the substrate is a glass substrate with high-temperature resistance or a flexible plastic substrate without high-temperature resistance.

In the step 1), the metal film is formed by using the method of magnetron sputtering or thermal evaporation, the transparent conductive film is formed by using the magnetron sputtering method.

In the step 2), the method for growing a layer of dielectric on the substrate is as follows: growing a layer of dielectric on the substrate by using the plasma enhanced chemical vapor deposition method; the method for growing a layer of high permittivity dielectric on the substrate is as follows: growing a layer of high permittivity dielectric on the substrate by using the method of magnetron sputtering or anodic oxidation.

In the step 4), the method for performing anodic oxidation treatment of the metals of the passivation region and the channel region is as follows: using an oxidation method of firstly a constant current mode and then a constant voltage mode, i.e., current density being 0.01~10 $mA/cm^2$ in the constant current mode, turning into the constant voltage mode when voltage increases to a predetermined value 1~500 V, keeping for about one hour in the constant voltage mode, then the current reducing down to less than 0.01 $mA/cm^2$, the anodic oxidation process is completed.

With the above technical solution the present invention has the following advantages: 1. With the anodic oxidation treatment of the first metal layer and the second metal layer, the first metal layer is converted into a metal oxide semiconductor layer and the second metal layer is converted into a metal oxide dielectric layer. The metal oxide semiconductor layer is a channel layer, the metal oxide dielectric layer becomes the passivation layer of the channel layer. The surface of the channel region is prevented from being bombarded by plasma by using this treatment method; 2. since the source and the drain of the thin film transistor are formed by double-layer metal films that consist of the first metal layer and the second metal layer which are not subjected to the anodic oxidation treatment, it is not needed to additionally add the source and drain metal layer process steps, thus the process for fabricating the transistor is simplified; 3. since anodic oxidation only needs to be performed at atmospheric pressure and room temperature, the operation is simple, the experimental equipment is simple, through the anodic oxidation, not only the channel layer and the passivation layer are formed but also the source and the drain are ensured to be low resistance metal, the process of the device is simplified and the production costs are reduced; at the same time, since the bottom metal is not in direct contact with solution during anodic oxidation of double-layer metal films because of the protection of the upper metal, some metals and their oxides that are not resistant to acid and alkali could also be anodized with the protection of upper metal. The present invention can be widely applied to the field of thin film transistors.

BRIEF DESCRIPTION OF THE DRAWINGS

FIG. 1.1 illustrates a schematic view of fabricating a gate electrode in embodiment 1 of the present invention.

FIG. 1.2 illustrates a schematic view of fabricating a gate dielectric layer in embodiment 1 of the present invention.

FIG. 1.3 illustrates a schematic view of fabricating a first metal layer in embodiment 1 of the present invention.

FIG. 1.4 illustrates a schematic view of fabricating a second metal layer in embodiment 1 of the present invention.

FIG. 1.5 illustrates a schematic view of fabricating a dielectric protection layer in embodiment 1 of the present invention.

FIG. 1.6 illustrates a schematic view of fabricating a channel region in embodiment 1 of the present invention.

FIG. 1.7 illustrates a schematic view of performing photolithography and etching to a dielectric protection layer, a first metal layer and a second metal layer to form an active region comprising a source, a drain and a channel region and a passivation region located above the channel region in embodiment 1 of the present invention.

FIG. 1.8 illustrates a schematic view of fabricating a passivation layer and contact holes in embodiment 1 of the present invention.

FIG. 1.9 illustrates a schematic cross-sectional view of a metal oxide thin film transistor fabricated in embodiment 1 of the present invention.

FIG. 2.1 illustrates a schematic view of fabricating a gate electrode in embodiment 2 of the present invention.

FIG. 2.2 illustrates a schematic view of fabricating a gate dielectric layer in embodiment 2 of the present invention.

FIG. 2.3 illustrates a schematic view of fabricating a first metal layer in embodiment 2 of the present invention.

FIG. 2.4 illustrates a schematic view of fabricating a second metal layer in embodiment 2 of the present invention.

FIG. 2.5 illustrates a schematic view of fabricating a dielectric protection layer in embodiment 2 of the present invention.

FIG. 2.6 illustrates a schematic view of fabricating a channel region in embodiment 2 of the present invention.

FIG. 2.7 illustrates a schematic view of performing photolithography and etching to a dielectric protection layer, a first metal layer and a second metal layer to form an active region comprising a source, a drain and a channel region and a passivation region located above the channel region in embodiment 2 of the present invention.

FIG. 2.8 illustrates a schematic view of fabricating a passivation layer and contact holes in embodiment 2 of the present invention.

FIG. 2.9 illustrates a schematic cross-sectional view of a metal oxide thin film transistor fabricated in embodiment 2 of the present invention.

FIG. 3.1 illustrates a schematic view of fabricating a gate electrode in embodiment 3 of the present invention.

FIG. 3.2 illustrates a schematic view of fabricating a gate dielectric layer in embodiment 3 of the present invention.

FIG. 3.3 illustrates a schematic view of fabricating a first metal layer in embodiment 3 of the present invention.

FIG. 3.4 illustrates a schematic view of fabricating a second metal layer in embodiment 3 of the present invention.

FIG. 3.5 illustrates a schematic view of fabricating a channel region in embodiment 3 of the present invention.

FIG. 3.6 illustrates a schematic view of fabricating an active region comprising a source, a drain and a channel region and a passivation region located above the channel region in embodiment 3 of the present invention.

FIG. 3.7 illustrates a schematic view of fabricating a passivation layer and contact holes in embodiment 3 of the present invention.

FIG. 3.8 illustrates a schematic cross-sectional view of a metal oxide thin film transistor fabricated in embodiment 3 of the present invention.

DETAILED DESCRIPTION OF EXAMPLE EMBODIMENTS

The present invention will be described in detail below in combination with the drawings and the embodiments.

Embodiment 1

As illustrated in FIG. 1.1 to FIG. 1.9, the present invention provides a method for fabricating a metal oxide thin film transistor. The method utilizes anodic oxidation of double-layer metal films to simultaneously form a channel layer and a passivation layer. The method specifically comprises the following steps:

1) as illustrated in FIG. 1.1, a substrate 1 is selected, a metal film of chromium, molybdenum, titanium, hafnium, tantalum or aluminum or the like or a transparent conductive film is grew on the substrate 1, then a gate electrode 2 is formed at a central position of the substrate 1 by using photolithography and etching the metal film or the transparent conductive film; wherein, the thickness of the metal film or the transparent conductive film is 100~300 nm; the metal film is formed by using a magnetron sputtering or thermal evaporation method, the transparent conductive film such as indium tin oxide (ITO) or the like is formed by a magnetron sputtering method.

2) as illustrated in FIG. 1.2, a layer of dielectric or a high permittivity dielectric (high-k) is grew on the substrate 1 and covers the gate electrode 2 as a gate dielectric layer 3; wherein, a method for growing a layer of dielectric on the substrate 1 is as follows: growing a layer of dielectric with thickness of 100~300 nm on the substrate 1 by using the method of Plasma Enhanced Chemical Vapor Deposition (PECVD), the dielectric is silicon nitride or silicon oxide or the like;

a method for growing a layer of high permittivity dielectric on the substrate 1 is as follows: growing a layer of high permittivity dielectric with thickness of 100~300 nm on the substrate 1 by using the method of magnetron sputtering or anodic oxidation, the high permittivity dielectric is hafnium oxide, tantalum oxide, aluminum oxide, or a stack consisting of hafnium oxide, tantalum oxide, aluminum oxide and other oxides, or the like, i.e., the high permittivity dielectric may consist of a single-layer, dual-layer or multilayer material.

3) As illustrated in FIG. 1.3, a first metal layer 4 with thickness of 10~100 nm is grew on the gate dielectric layer 3, the growing method may use a direct current magnetron sputtering method, metal or alloy target is used, the purity is greater than or equal to 99.99%, sputtering pressure is 0.3~2.5 Pa, gas is pure argon; wherein, the first metal layer 4 is a metal material which may be an elementary substance material and may also be an alloy material, the elementary substance material is, for example, indium (In), zinc (Zn), tin (Sn), copper (Cu), nickel (Ni), titanium (Ti), molybdenum (Mo), tungsten (W) or the like, the alloy material is, for example, indium tin, zinc titanium, zinc tin, indium zinc tin or the like.

4) As illustrated in FIG. 1.4, a second metal layer 5 with thickness of 50~300 nm is grew on the first metal layer 4, the growing method also uses a direct current magnetron sputtering method, metal or alloy target is used, the purity is greater than or equal to 99.99%, sputtering pressure is 0.3~2.5 Pa and gas is pure argon; wherein, the second metal layer 5 is a metal material, for example, aluminum (Al), titanium (Ti), tantalum (Ta), hafnium (Hf), zirconium (Zr) or the like.

5) As illustrated in FIG. 1.5 and FIG. 1.6, a channel region 6 is fabricated at a middle position of the first metal layer 4 and a passivation region 7 is fabricated at a middle position of the second metal layer 5, the passivation layer 7 is located on the channel region 6. Then the metals of the passivation region 7 and the channel region 6 are anodized at atmospheric pressure and room temperature, the anodic oxidation turns the first metal layer 4 into a metal oxide semiconductor layer and turns the second metal layer 5 into a metal oxide dielectric layer; the metal oxide semiconductor layer is a channel layer of the thin film transistor in the present invention, and the metal oxide dielectric layer becomes a passivation layer of the channel layer; wherein, a method for fabricating the channel region 6 and the passivation region 7 is as follows: growing a layer of silicon nitride thin film with thickness of 50 nm as a dielectric protection layer 51 on the second metal layer 5 by using a plasma enhanced chemical vapor deposition method, coating photoresist 61 on the dielectric protection layer 51, performing photolithography and etching to the medium protection layer 51, the passivation region 7 is exposed at the middle position of the second metal layer 5, the region of the first metal layer 4 to which the passivation region 7 corresponds is the channel region 6, the channel region 6 of the first metal layer 4 and the passivation region 7 of the second metal layer 5 need to be anodized to turn the metal into oxides; the other portion is covered and protected by the dielectric protection layer 51;

a method for performing anodic oxidation treatment of metals of the passivation region 7 and the channel region 6 is as follows: using an oxidation method of firstly a constant current mode and then a constant pressure mode, i.e., current density being 0.01~10 $mA/cm^2$ in a constant current mode, turning into a constant voltage mode when the voltage increases to a predetermined value 1~500 V, keeping for about one hour in the constant pressure mode, then the current reducing down to less than 0.01 $mA/cm^2$, an anodic oxidation process is completed;

the metal oxide semiconductor layer may be indium oxide ($In_2O_3$), zinc oxide (ZnO), stannic oxide ($SnO_2$), stannous oxide (SnO), cuprous oxide ($Cu_2O$), nickel oxide (NiO), titanium oxide ($TiO_2$), molybdenum oxide ($MoO_3$) or tungsten oxide ($WO_3$), and may also be a combination of two components or multiple components of the foresaid materials, such as indium tin oxide ($InO_2$:Sn, ITO for short), indium zinc oxide (IZO), zinc tin oxide (TZO), indium zinc tin oxide (TIZO) or the like; the metal oxide dielectric layer may be aluminum oxide ($Al_2O_3$), titanium oxide ($TiO_2$), tantalum oxide ($Ta_2O_5$), hafnium oxide ($HfO_2$), zirconium oxide ($ZrO_2$) or the like;

since anodic oxidation treatment adopted by the present invention is performed at atmospheric pressure and room temperature, the process is a simple, low-cost and low-temperature process and is suitable for mass production. Furthermore, variables involved in an anodic oxidation treatment are mainly oxidation voltage and oxidation current, thus the controllability and the repeatability of fabrication are improved.

6) As illustrated in FIG. 1.7, a source 8 and a drain 9 are fabricated, forming an active region comprising the source 8, the drain 9 and the channel region 6; the source 8 and the drain 9 are located on two sides of the channel region 6 and connected with the channel region 6, the source 8 and the drain 9 are composed of double-layer metal films that consist of the first metal layer 4 and the second metal layer 5 which are not subjected to the anodic oxidation treatment; wherein, a method for fabricating the source 8 and the drain 9 is as follows: removing the photoresist 61, using photolithography and etching the dielectric protection layer 51, the first metal layer 4 and the second metal layer 5 under the dielectric protection layer 51, forming an active region comprising the source 8, the drain 9 and the channel region 6.

7) As illustrated in FIG. 1.8, a silicon nitride layer 10 is deposited on the active region by using a method of plasma enhanced chemical vapor deposition or magnetron sputtering, the silicon nitride layer 10 covers the gate dielectric layer 3, then photolithography and etching are used on the silicon nitride layer 10 on one side of the source 8 and one side of the drain 9, forming two contact holes 11, 12 of electrodes; wherein the thickness of the silicon nitride layer 10 is 100~300 nm.

8) As illustrated in FIG. 1.9, a layer of metal aluminum film is deposited on the top surface of the entire device by using a magnetron sputtering method, then two metal contact electrodes 11, 12 of the thin film transistor are fabricated by photolithography and etching, the metal contact electrodes 11, 12 lead out each electrode of the thin film transistor, the fabrication of the metal oxide thin film transistor is completed; wherein the thickness of the metal aluminum film is 100~300 nm.

In the above step 1), the substrate 1 may be a substrate with high-temperature resistance or a flexible substrate without high-temperature resistance, the substrate with high-temperature resistance is, for example, a glass substrate, the flexible substrate without high-temperature resistance is, for example, a plastic substrate.

Embodiment 2

As illustrated in FIG. 2.1 to FIG. 2.9, a method for fabricating a metal oxide thin film transistor disclosed in this embodiment is similar to the method disclosed in embodiment 1, and the differences are as follows:

in step 5), a method for fabricating the channel region 6 and the passivation region 7 is as follows: growing a layer of silicon nitride film with thickness of 50 nm as a dielectric protection layer 51 on the second metal layer 5 by using a plasma enhanced chemical vapor deposition method, and coating photoresist 61 on the dielectric protection layer 51, then by the exposure and development of the photoresist 61, opening a window on the dielectric protection layer 51, but not etching the dielectric protection layer 51, the region of the window corresponds to the channel region 6 and the passivation region 7 of the transistor.

Embodiment 3

As illustrated in FIG. 3.1 to FIG. 3.8, a method for fabricating a metal oxide thin film transistor disclosed in this embodiment is similar to the method disclosed in embodiment 1, and differences lie in the follows:

In step 5), as illustrated in FIG. 3.5, a method for fabricating the channel region 6 and the passivation region 7 is as follows: coating photoresist 61 on the second metal layer 5, then by the exposure and development of the photoresist 61 the passivation region 7 of the second metal layer 5 is exposed, a region of the first metal layer 4 to which the passivation region 7 corresponds is the channel region 6, the other portion is covered and protected by the photoresist layer.

In step 6), as illustrated in FIG. 3.6, a method for fabricating the source 8 and the drain 9 is as follows: removing the photoresist layer 61, using photolithography and etching the first metal layer 4 and the second metal layer 5, forming an active region comprising the source 8, the drain 9 and the channel region 6.

In the above embodiments, the channel region 6 and the passivation region 7 are treated by anodic oxidation treatment and converted into metal oxides in the present invention. The source 8 and the drain 9 of the thin film transistor are formed by the metal films which are not subjected to the anodic oxidation treatment, source and drain metal layer process steps are not needed, thus the process for fabricating the thin film transistor is simplified.

The above embodiments are just used for describing the present invention. Connections and structures of all components may all be varied. Improvements and equivalent replacements made for connections and structures of individual components according to the principle of the present invention on the basis of the technical solution of the present invention should not be excluded from the scope of protection of the present invention.

The invention claimed is:

1. A method for fabricating a metal oxide thin film transistor, comprising the following steps:
   1) selecting a substrate, growing a layer of metal film or transparent conductive film on the substrate, then forming a gate electrode at a central position of the substrate by using photolithography and etching on the metal film or the transparent conductive film;
   2) growing a layer of dielectric or high permittivity dielectric on the substrate, the layer of dielectric or high permittivity dielectric covering the gate electrode as a gate dielectric layer;
   3) growing a first metal layer with a thickness of 10-100 nm on the gate dielectric layer, the growing method uses a direct current magnetron sputtering method, wherein a metal or alloy target is used, a purity of the metal or alloy target is greater than or equal to 99.99%, a sputtering pressure is 0.3-2.5 Pa, and a gas is pure argon;
   4) growing a second metal layer with a thickness of 50-300 nm on the first metal layer, the growing method also uses the direct current magnetron sputtering method, a metal or alloy target is used, a purity of the metal or alloy target is greater than or equal to 99.99%, a sputtering pressure is 0.3-2.5 Pa, a gas is pure argon;
   5) fabricating a channel region at a middle position of the first metal layer, fabricating a passivation region at a middle position of the second metal layer, the passivation region is located on the channel region; then the first and second metal layers of the passivation region and the channel region are anodized at atmospheric pressure and room temperature, anodic oxidation turns the first metal layer into a metal oxide semiconductor layer and turns the second metal layer into a metal oxide dielectric layer; the metal oxide semiconductor layer is the channel region of the metal oxide thin film transistor, the metal oxide dielectric layer becomes the passivation region of the channel region;
   6) fabricating a source and a drain, forming an active region comprising the source, the drain and the channel region; the source and the drain are located on two sides of the channel region and connected with the channel region, the source and the drain are formed by double-layer metal films of the first metal layer and the second metal layer which are not subjected to the anodic oxidation;
   7) depositing a silicon nitride layer on the active region by plasma enhanced chemical vapor deposition or magnetron sputtering, the silicon nitride layer covering the gate dielectric layer, then photolithography and etching are used on the silicon nitride layer on one side of the source and one side of the drain, forming two contact holes of electrodes;
   8) depositing a layer of metal aluminum film by a magnetron sputtering method, then fabricating two metal contact electrodes of the metal oxide thin film transistor by photolithography and etching.

2. The method for fabricating the metal oxide thin film transistor according to claim 1, wherein, in the step 5), the method for fabricating the channel region and the passivation region is as follows:
   growing a layer of silicon nitride film with a thickness of 50 nm on the second metal layer by a plasma enhanced chemical vapor deposition method as a dielectric protection layer, coating a photoresist on the dielectric protection layer, using photolithography and etching on the dielectric protection layer, wherein the passivation region is exposed at the middle position of the second metal layer, a region of the first metal layer to which the passivation region corresponds is the channel region.

3. The method for fabricating the metal oxide thin film transistor according to claim 2, wherein, in the step 6), the method for fabricating the source and the drain is as follows:
   removing the photoresist, using photolithography and etching on the dielectric protection layer and the first metal layer and the second metal layer under the dielectric protection layer, and forming the source and the drain.

4. The method for fabricating the metal oxide thin film transistor according to claim 1, wherein, in the step 5), the method for fabricating the channel region and the passivation region is as follows:
   growing a layer of silicon nitride film with a thickness of 50 nm on the second metal layer by a plasma enhanced chemical vapor deposition method as a dielectric protection layer, coating a photoresist on the dielectric protection layer, then by exposure and development of the photoresist, opening a window on the dielectric protection layer without etching the dielectric protection layer, a region of the window corresponds to the channel region and the passivation region of the transistor.

5. The method for fabricating the metal oxide thin film transistor according to claim 1, wherein, in the step 5), the method for fabricating the channel region and the passivation region is as follows:
   coating photoresist on the second metal layer, then by exposure and development of the photoresist, the passivation region of the second metal layer is exposed, a region of the first metal layer to which the passivation region corresponds is the channel region, other portions are covered and protected by the photoresist.

6. The method for fabricating the metal oxide thin film transistor according to claim 5, wherein, in the step 5), the method for fabricating the source and the drain is as follows:
   removing the photoresist, using photolithography and etching on the first metal layer and the second metal layer, thereby forming the source and the drain.

7. The method for fabricating the metal oxide thin film transistor according to claim 1, wherein, in the step 1), the substrate is a glass substrate with high-temperature resistance or a flexible plastic substrate without high-temperature resistance.

8. The method for fabricating the metal oxide thin film transistor according to claim 1, wherein, in the step 1), the metal film is formed by magnetron sputtering or thermal evaporation, and the transparent conductive thin film is formed by a magnetron sputtering method.

9. The method for fabricating the metal oxide thin film transistor according to claim 1, wherein, in the step 2), the method for growing the layer of dielectric on the substrate is as follows:

growing the layer of dielectric on the substrate by a plasma enhanced chemical vapor deposition method; and wherein the method for growing the layer of high permittivity dielectric on the substrate is as follows: growing the layer of high permittivity dielectric on the substrate by magnetron sputtering or anodic oxidation.

10. The method for fabricating the metal oxide thin film transistor according to claim 1, wherein, in the step 4), the method for performing anodic oxidation of the first and second metal layers of the passivation region and the channel region is as follows:

using an oxidation method of a constant current mode and then a constant voltage mode, a current density being 0.01-10 $mA/cm^2$ in the constant current mode, turning into the constant voltage mode when a voltage increases to a predetermined value of 1-500 V, keeping for about one hour in the constant current mode, then reducing the current density to less than 0.01 $mA/cm^2$.

* * * * *